United States Patent
Sheahan

(10) Patent No.: US 7,969,138 B2
(45) Date of Patent: Jun. 28, 2011

(54) METHOD FOR CALIBRATING A MOTOR CONTROL CIRCUIT TO IMPROVE TEMPERATURE MEASUREMENT IN A ELECTRICAL MOTOR

(75) Inventor: Thomas J. Sheahan, Cary, IL (US)

(73) Assignee: Nidec Motor Corporation, St. Louis, MO (US)

( * ) Notice: Subject to any disclaimer, the term of this patent is extended or adjusted under 35 U.S.C. 154(b) by 0 days.

(21) Appl. No.: 12/869,145

(22) Filed: Aug. 26, 2010

(65) Prior Publication Data
US 2010/0320947 A1    Dec. 23, 2010

Related U.S. Application Data

(62) Division of application No. 12/167,975, filed on Jul. 3, 2008, now Pat. No. 7,791,328.

(51) Int. Cl.
    *G01R 19/00*     (2006.01)
    *G01R 31/06*     (2006.01)

(52) U.S. Cl. ..................... 324/76.11; 324/510

(58) Field of Classification Search .................. 324/546, 324/551, 527, 772, 510
See application file for complete search history.

(56) References Cited

U.S. PATENT DOCUMENTS

| | | | |
|---|---|---|---|
| 5,811,956 A * | 9/1998 | Yamamoto | 318/801 |
| 6,593,751 B2 * | 7/2003 | Takahashi | 324/551 |
| 6,690,137 B2 | 2/2004 | Iwajj et al. | |
| 6,949,945 B2 | 9/2005 | Klein | |
| 7,265,954 B2 | 9/2007 | Hikawa et al. | |
| 2006/0179895 A1 | 8/2006 | Thorn et al. | |

* cited by examiner

*Primary Examiner* — Vincent Q Nguyen
(74) *Attorney, Agent, or Firm* — Maginot, Moore & Beck LLP

(57) ABSTRACT

A method enables measurement of an inverter loss within a motor control circuit for an appliance. The method includes applying a constant DC current generated from a first AC supply voltage to a motor winding through an inverter at a first duty cycle, measuring a first voltage corresponding to the current through the motor at a motor current sense resistor, computing a first ratio of the first measured voltage at the motor current sense resistor to a first DC input voltage corresponding to the first AC supply voltage, identifying a second duty cycle from the first computed ratio, comparing the second duty cycle to the first duty cycle, and identifying a first inverter loss factor from the difference between the first duty cycle and the second duty cycle.

9 Claims, 3 Drawing Sheets

METHOD FOR CALIBRATING A MOTOR CONTROL CIRCUIT TO IMPROVE TEMPERATURE MEASUREMENT IN A ELECTRICAL MOTOR

CLAIM OF PRIORITY

This application is a divisional application of and claims priority to U.S. patent application Ser. No. 12/167,975 that was filed on Jul. 3, 2008, is entitled Method And System For Calibrating A Motor Control Circuit To Improve Temperature Measurement In An Electrical Motor, and that will issue as U.S. Pat. No. 7,791,328 on Sep. 7, 2010.

TECHNICAL FIELD

This disclosure relates generally to electrical motor control and, more particularly, to the measurement of a resistance of an electrical motor winding to identify a temperature for the electrical motor.

BACKGROUND

Three-phase motors are used in various applications. The motors are typically energized with a power source that provides electrical energy in a variety of forms. In one form, the input signal is a sine wave with each of the three motor leads being driven with a voltage or current sine wave that has a 120 degree phase difference between each lead. In the other form, "trapezoidal commutation" is used to provide a controlled current that drives only two of the three motor leads at any point in time. Sine waves are typically used to drive larger, higher performance alternating current (AC) motors, while lower cost trapezoidal commutation is typically used for small AC motors. In some applications, an AC energy source is rectified to generate a direct current (DC) voltage that is applied to a DC motor through an inverter having half-bridges. A motor controller, such as a digital signal processor (DSP), selectively activates the half-bridges of the inverter to apply the DC voltage to the windings of the DC motor. Typically, the selective activation of the half-bridges is performed by the application of pulse-width modulated (PWM) signals to driver circuits that interface the DSP to the half-bridges of the inverter.

As a motor is operated, the motor generates heat. In particular, varying the load on a motor or the speed at which a motor is rotated causes the motor to generate heat. As a motor gets warmer, the risk of motor damage increases if operation of the motor is sustained at temperatures that may degrade motor components. Consequently, the motor controller needs to reduce or terminate supply of current to the motor in response to the temperature of the motor exceeding some temperature threshold. In previous motor controllers, a temperature sensor may be placed in a lead to a motor. The sensor generates a signal that corresponds to a temperature in the motor. The motor controller may then monitor the signal from the sensor and compare the signal to a temperature threshold. As the signal approaches or exceeds the threshold, the motor controller may alter the manner in which the controller provides current to the motor.

While the monitoring of temperature in a motor lead with a temperature sensor is a viable method of motor current regulation, that method requires the expense of a temperature sensor in the motor lead. In machines that are mass-produced, such as washing machines or dryers, the expense of a temperature sensor in each machine may add significant costs to the manufacture of the machines at the necessary production rates. Thus, measurement of temperatures within an electrical motor without the use of temperature sensors would be beneficial.

SUMMARY

A method enables measurement of an inverter loss within a motor control circuit for an appliance for the purpose of more accurately measuring motor temperature. The method includes applying a constant DC current generated from a first AC supply voltage to a motor winding through an inverter at a first duty cycle, measuring a first voltage corresponding to the current through the motor at a motor current sense resistor, computing a first ratio of the first measured voltage at the motor current sense resistor to a first DC input voltage corresponding to the first AC supply voltage, identifying a second duty cycle from the first computed ratio, comparing the second duty cycle to the first duty cycle, and identifying a first inverter loss factor from the difference between the first duty cycle and the second duty cycle.

An electrical circuit enables computation of inverter losses occurring during operation of an electrical motor in a household appliance. The circuit includes an inverter having a plurality of half-bridges for selectively coupling windings of an electrical motor to a power supply bus, an electrical motor configured for selective coupling to the inverter, a current sense circuit coupled between the inverter and electrical ground and between the windings of the electrical motor and electrical ground, and a digital signal processor (DSP) coupled to the inverter, the power supply bus, and the current sense circuit, the DSP being configured to identify a leakage current through the inverter at each of at least two different voltages for the power supply bus.

BRIEF DESCRIPTION OF THE DRAWINGS

The foregoing aspects and other features of a circuit in which a temperature in a lead of an electrical motor may be measured without a temperature sensor are explained in the following description, taken in connection with the accompanying drawings, wherein.

DETAILED DESCRIPTION

Figure 1:
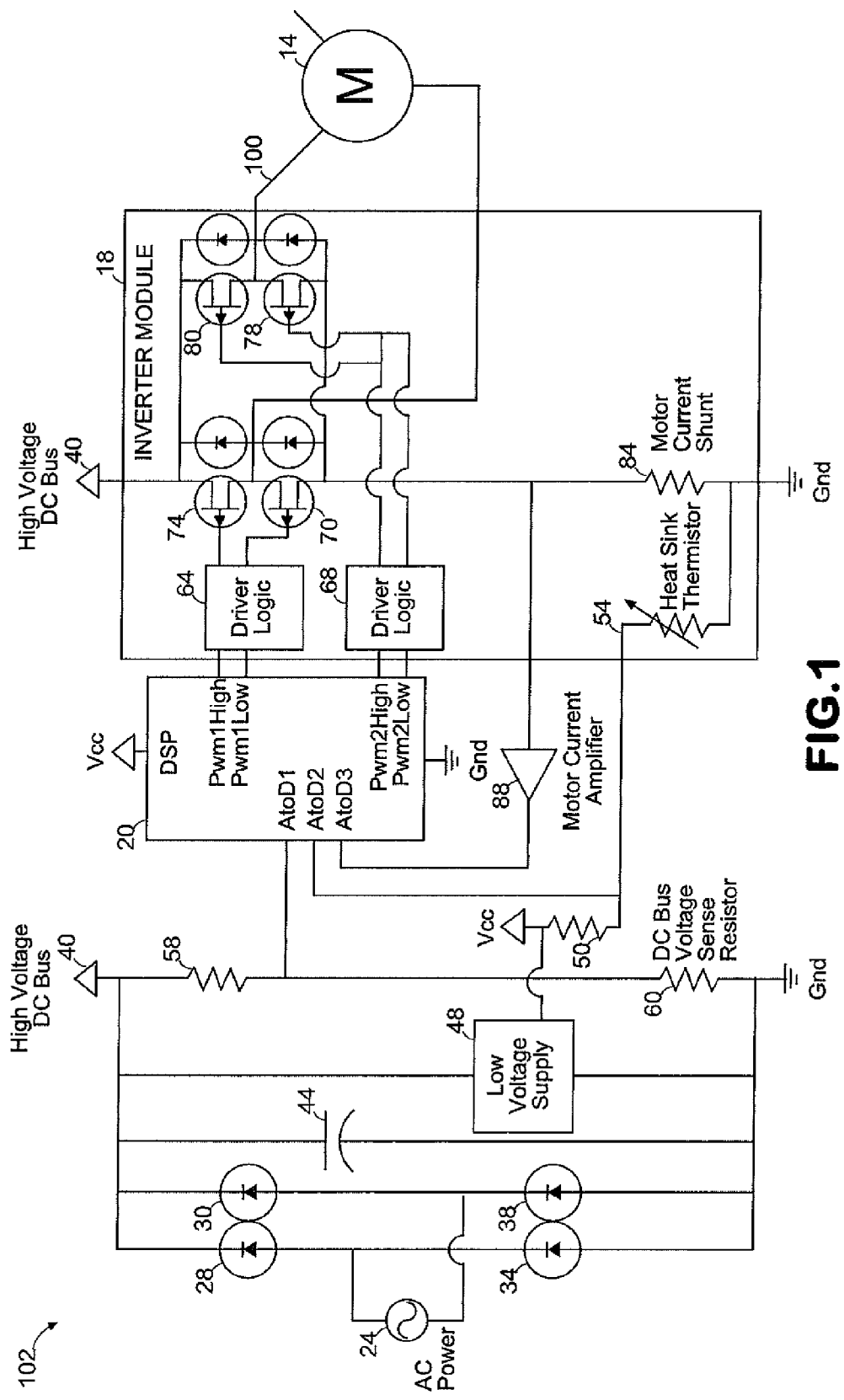
FIG. 1 is a schematic diagram of a circuit that enables temperature in an electrical motor winding to be measured without a temperature sensor.

A circuit 10 in which a conventional electrical DC motor 14 is driven by an inverter 18 under the control of a DSP 20 is shown in FIG. 1. In the exemplary circuit shown in FIG. 1, the motor 14 rotates a clothes drum in a washing machine. Electrical power is provided by an AC supply 24. The AC power signal is rectified by the diodes 28, 30, 34, and 38. The resulting DC voltage is provided by a DC bus 40 to the input of the inverter 18. A capacitor 44 helps maintain the DC voltage near a constant value. A low voltage supply 48 includes a step down transformer to generate a second DC voltage Vcc, which is used to power the electronics of a motor control circuit that includes the DSP 20 and the thermistor 54.

With continued reference to FIG. 1, the voltage on the DC bus is provided across a voltage divider that includes resistor 58 and 60. The voltage between these two resistors is provided to an analog-to-digital converting input of the DSP 20. This voltage is measured by the DSP 20 and used with the values of the resistors 58 and 60 to compute the supply voltage on the high DC voltage bus 40. The term "high DC voltage" distinguishes the voltage bus 40 from the DC electronic supply voltage Vcc provided by low voltage supply 48. In accordance with programmed instructions stored in a memory of the DSP 20, the DSP 20 generates PWM signals in a known manner for the drivers 64 and 68. The PWM signals are converted by the drivers 64 and 68 in a known manner to activate the insulated gate bipolar transistors (IGBTs) 70, 74, 78, and 80 that compose the half-bridges of the inverter 18 in a selective manner. Although three half-bridges are provided, one for each lead of the motor 14, only two are depicted in FIG. 1 to simplify the discussion of the circuit. The selective activation of these IGBTs selectively couples a winding of the motor 14 to the voltage on the high voltage DC bus 40 at a duty cycle determined by the DSP 20. The resulting current flowing through the winding helps energize the motor. The currents from the motor windings exit from the corresponding half-bridge of the inverter and are dropped across the motor shunt resistor 84 to provide a voltage that is provided to an input of the operational amplifier 88. The op-amp 88 is configured in a known manner with a bias voltage that compensates for a DC offset error and keeps the zero reference point for the op-amp output near a voltage that is approximately one-half of Vcc. This configuration enables the output voltage of the op-amp 88 to fluctuate about the zero reference point to indicate positive and negative motor currents. The output of the operational amplifier 88 is coupled to a second analog-to-digital converting input of the DSP 20. During operation of the washing machine, the output voltage of the op-amp 88 corresponds to the current through the inverter 18 and the winding in the motor 14. During calibration, the DSP 20 uses this current input in a manner described below to compute the voltage across the inverter. This current input is then used by the DSP 20 to adjust a voltage corresponding to a motor current during operation of the washing machine and more accurately measure the change in the resistance of a winding in the motor 14.

A third analog-to-digital input of the DSP 20 is coupled to a voltage divider formed by the resistor 50 and the thermistor 54. The signal varies as temperature causes the resistor of the thermistor 54 to vary. Thus, DSP 20 uses the voltage signal from the divider to identify the temperature of a heat sink on the motor control circuit board. This temperature may be used as discussed more fully below to identify a temperature correction factor for the circuit board electronics.

For calibration, the DSP communicates with factory calibration equipment through a serial communication link, which may be implemented through a wired port or a wireless port, such as an infrared port. The programmed instructions of the DSP in FIG. 1 may include instructions that configure the DSP 20 to perform a calibration procedure that computes parameters for operation of the motor. These parameters enable the DSP 20 to measure more accurately changes in the resistance of a winding in the motor 14. These changes are monitored because they indicate the operating temperature of the motor.

Figure 2:
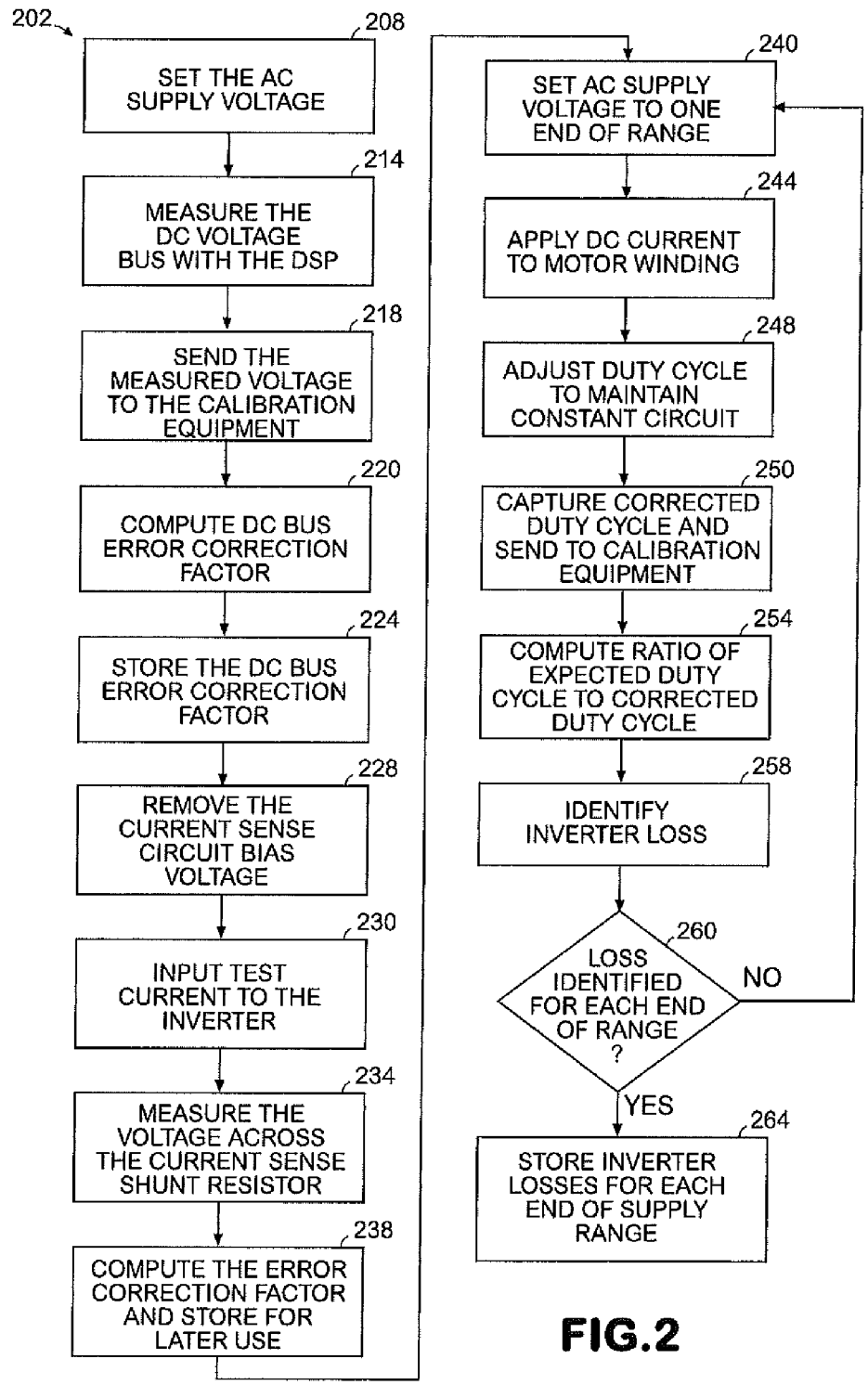
FIG. 2 is a flow diagram of a method that may be implemented with the circuit of FIG. 1 to identify inverter losses in a motor control circuit for an appliance.

To perform a calibration procedure, such as the process 200 shown in FIG. 2, factory calibration equipment is coupled to the DSP of a motor control circuit, such as the one shown in FIG. 1, for data communication. To commence the procedure, the factory calibration equipment sets the AC supply voltage to a level within the operating range of the AC supply in a typical environment where the appliance is used (block 208). The low end of the AC supply range corresponds to the lowest AC voltage likely to be encountered from a household outlet, for example, while the high end of the range corresponds to the highest AC voltage likely to be encountered in a household. Accordingly, the lowest AC voltage in one embodiment is 90 VAC and the highest AC voltage is 132 VAC. Once the AC power supply output level is set, the DSP 20 receives a message from the factory calibration equipment to measure the high DC voltage bus (block 214). The measured voltage is sent in a message from the DSP 20 to the factory calibration equipment (block 218). The factory calibration equipment compares the expected DC voltage corresponding to the AC voltage setting and the DC bus voltage measured by the DSP 20 and computes a DC supply error factor that corresponds to the difference between the expected DC supply voltage and the measured DC supply voltage (block 220). This DC supply error factor is sent by the factory calibration equipment to the DSP 20, which stores the factor for later use (block 224).

The calibration process continues by measuring error in the current sense circuit. The bias voltage to op-amp 88, which was discussed above, is removed from the op-amp (block 228) so the full op-amp range is available for measuring the voltage across the shunt resistor 84. Additionally, a motor lead, such as lead 100, is de-coupled from the motor 14 and a test current is input to the inverter 18 at the connection for the de-coupled motor lead (block 230). The DSP 20 is not operating the driver circuits so the voltage across the shunt resistor 84 is expected to correspond closely to the test current times the current sense resistor 84. The DSP 20 measures the voltage output by the op-amp 88 and sends the measured voltage to the factory calibration equipment (block 234). The difference between the expected voltage across resistor 84 and the measured voltage corresponds to an error in the current sense circuit. The factory calibration equipment computes that difference and provides it to the DSP 20 for storage as a current sense correction factor (block 238). In one embodiment, the test current is −2 amps.

During operation of the inverter 18 to couple the motor to the high DC voltage bus 40, the IBGTs and the flyback diodes, such as diodes 92, 94, 96, and 98, do not switch instantaneously. To obtain a predetermined voltage at a motor lead, both the upper and the lower IBGTs for a half-bridge are driven at 180 degrees out of phase. The low portion of the PWM signal from the DSP turns on a specific IBGT. To prevent an upper and a lower IBGT of the same half-bridge from turning on at the same time, which would short the DC voltage bus across the shunt resistor to electrical ground, a dead time is inserted in the PWM cycle. During the dead time, both IGBTs are turned off. After the dead time, the active IGBT is turned on while the other IBGT may still be turning off. This connection through the two IGBTs is small and is known as shoot through. The shoot through does not reach the motor. Combining the dead time, shoot through, and turn on delay yields the voltage loss across the inverter. This voltage loss is calculated from the equation: aVbus+b. The two point calibration process described below may be used to identify the a and b terms in the equation.

In the calibration process shown in FIG. 2, a leakage current is established for the low end of the DC bus voltage range and a leakage current is established for the high end of the DC bus voltage range. These two points are used to define a linear relationship over the operating range of the DC bus voltage. As explained more fully below, this relationship is used during operation of the motor for the washing machine to identify and subtract the portion of the measured voltage across resistor 84 that is attributable to the leakage current through the inverter 18 so the remaining voltage more accurately identifies the resistance change in the motor winding.

To measure the leakage currents at the endpoints of the DC supply voltage, the motor is re-coupled to the inverter 18. The factory calibration equipment then sets the AC supply voltage to the low end of the input range (block 240) and sends a message to the DSP 20 to provide a test current through the motor. Upon receipt of the message, the DSP 20 generates PWM signals for the drivers 64, 68 to apply a DC current at a duty cycle computed to maintain the current through the windings at the test current level (block 244). In one embodiment, the test current is +2 amps. Additionally, the motor is a reference motor in which the windings have been precisely measured. The DSP 20 periodically measures the voltage across the shunt resistor 84 and adjusts the duty cycle for the drivers to maintain the current through the shunt resistor at the test current (block 248). If the DSP reads the shunt voltage at the proper time within the PWM cycle, the shunt voltage would reflect the expected 2 amp value through the resistance of the reference motor. The losses occurring from the IGBT switching, flyback diodes, and dead time, however, result in the PWM duty cycle being increased to provide the expected 2 amps. The corrected duty cycle is the duty cycle actually used by the DSP to maintain the test current. This duty cycle is periodically sent in a data message to the factory calibration equipment (block 250). Using the corrected DC voltage factor, a ratio of an expected PWM duty cycle and the corrected PWM duty cycle is computed (block 254). In one embodiment, the ratio is computed by the calibration factory equipment, although the DSP may be configured through its programmed instructions to perform the computation. The expected PWM duty cycle is the duty cycle that would be applied to the corrected DC bus voltage to obtain a voltage corresponding to the resistance of the reference motor winding and the test current being maintained by the DSP, if no current leaked through the inverter. Multiplying the computed ratio by the corrected DC bus voltage yields the actual voltage drop across the motor winding. These data may be used to establish an inverter loss factor that corresponds to the loss through the inverter at the low end of the DC voltage range (block 258). The inverter loss factor may be computed by the factory calibration equipment in response to data messages from the DSP providing the data for the computation or the DSP may be configured to compute the inverter loss factor. The factory calibration equipment then determines whether an inverter loss factor has been identified for each end of the AC supply range (block 260). If an inverter loss factor has been established for each end of the AC supply range, then these two inverter loss factors are sent to the DSP for storage and later use during operation of the washing machine motor (block 264). Otherwise, the AC supply level is set for the other end of the AC supply range (block 240) and the process (blocks 244-258) is repeated to establish the inverter loss factor for the other end of the AC supply range.

Figure 3:
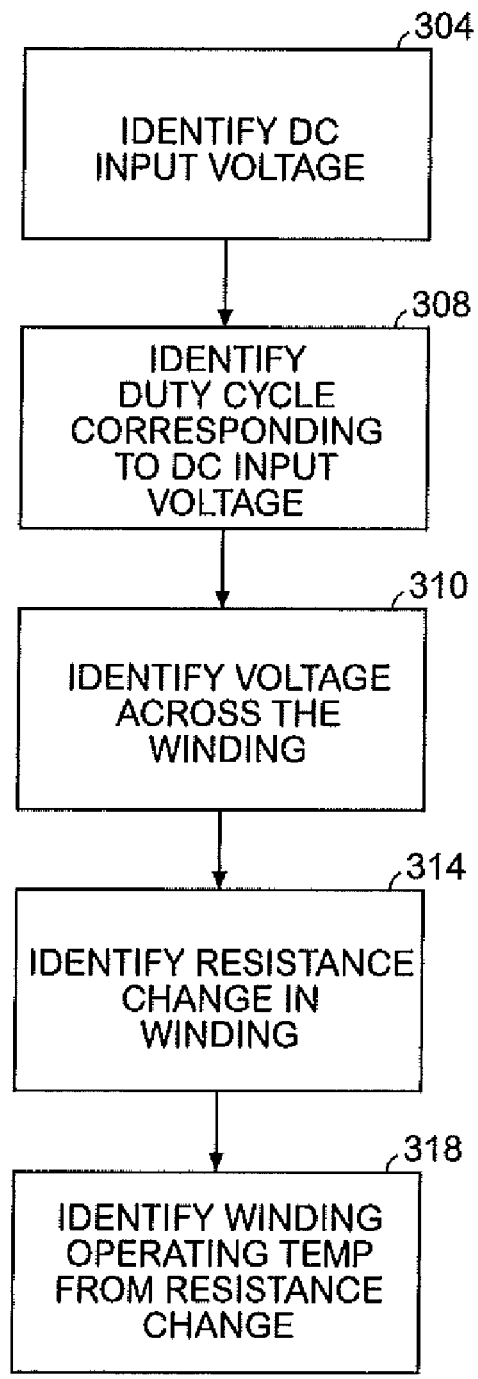
FIG. 3 is a flow diagram of a method that may be implemented with the circuit of FIG. 1 to measure more accurately a voltage drop across the inverter of FIG. 1.

During operation of a washing machine cycle, such as spin or agitate, the DSP is able to cease driving the motor for a relatively brief time that does not interfere with performance of the cycle and perform a temperature monitoring check. This check is shown in FIG. 3. In this process 300, the DSP determines the DC input voltage on the bus 44 using the voltage measured between resistors 58 and 60 and the input voltage error correction factor discussed above (block 304). Using the two error factors for the inverter loss, the DSP identifies a duty cycle for the DC input voltage on the line between the two points established during calibration (block 308). This duty cycle is the duty cycle that would be used if no current loss was occurring through the inverter. Multiplying this duty cycle by the DC input voltage yields the actual voltage being dropped across the winding (block 310). This voltage is then compared in a known manner to a voltage drop across the winding at a known temperature to compute the change in resistance for the winding (block 314). The change in resistance is then used to identify an operating temperature for the motor (block 320). The DSP can then evaluate whether the motor should be shut down or otherwise operated differently because of heat losses. Experimental data have indicated that without the measurement correction provided by the inverter loss factors, the effective inverter output voltages may be off as much as ±5V. Because the motors used in washing machines or similar appliances typically have winding resistances of 5-6 ohms and the test currents are typically around 2 amps, a 5 volt error in what should be a 10-12 volt signal can be significant. Therefore, accounting for the inverter losses through the error correction relationship identified during a calibration procedure, like the one shown in FIG. 2, greatly enhances the accuracy of the temperature monitoring in the appliance.

Another component of error in measurements made during operation of the washing machine or other appliance arises from the effect of temperature on the electronic components used in the motor control circuit of FIG. 1. To address inaccuracies caused by thermal conditions, engineering samples of the circuit boards are operated in a test chamber in a manner that enables the temperature on the control circuit to climb. The communication link to the DSP is coupled to a data collection device, such as a computer, that receives the error-corrected DC bus voltage measurements and error-corrected shunt voltage measurements. Additionally, voltages across the heat sink thermistor 54 are measured and sent to the data collection device so the measurements can be coordinated with temperatures computed from the thermistor voltage measurements. An external voltage measuring system having environmentally conditioned components is also coupled to the DC voltage bus and the shunt resistor to measure these voltages. The data collection device also receives these measurements and compares them to the measurements received from the DSP. The comparisons identify the differences between corresponding voltage measurements at the measured temperatures. These differences are used by the data collection device to compute a voltage error correction factor for the DC voltage bus and another error correction factor for the shunt resistor. Alternatively, multiple differences may be plotted with respect to temperature to define an error correction curve. These correction factors or curves are stored in the memory of the DSP 20 for each appliance. During operation of the motor in the appliance, the DSP 20 calculates a temperature for the heat sink from the thermistor voltage. This temperature is used to identify a corresponding error-correction factor or point on an error-correction curve. The error correction data are then used to adjust the DC bus voltage and shunt voltage measurements. In some embodiments, these differences have been found to affect the motor temperature computations by as much as 20 degrees C.

In some previously known motor controllers, operational parameters were stored in EEPROMs electrically coupled to the DSP. Because the DSP could assert a programming voltage to write data into these EEPROMs, the DSP was able to corrupt data stored in the EEPROMs. To reduce the risk that the initial resistance and temperature would be corrupted, these parameters are preferably stored in the mask memory embedded in the DSP. The factory manufacturing the DSP sets the internal DSP flash protection in a known manner to lock the DSP embedded software from corrupting the stored parameters.

After installation of the DSP into the motor 14, the DSP is provided a signal that causes the DSP to execute programmed instructions for regulating the delivery of DC current to the motor 14. Periodically, the DSP 20, configured by the programmed instructions, measures the thermistor voltage to compute a temperature for the heat sink. Using a known relationship between a reference temperature and the difference between the winding resistance of a reference motor and the resistance corresponding to the current being sensed by the operational amplifier 88, the DSP calculates a temperature for the motor. This calculated temperature may be compared to a temperature threshold and in response to the temperature threshold being reached or exceeded, the DSP ceases to generate PWM signals for the delivery of DC current to the motor. Thus, the motor is provided with temperature protection without requiring an additional component for temperature measurement at the motor winding.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

I claim:

1. A method for enabling computation of inverter losses occurring during operation of an electrical motor comprising:
    identifying a first leakage current through an inverter while the inverter is operatively coupling windings of an electrical motor to a power supply bus supplying current at a first voltage;
    identifying a second leakage current through the inverter while the inverter is operatively coupling windings of the electrical motor to the power supply bus supplying current at a second voltage; and
    identifying a linear relationship between the first and the second leakage currents.

2. The method of claim 1, the identification of the first and the second leakage currents further comprising:
    identifying the first and the second leakage currents with reference to a PWM duty cycle and a corrected PWM duty cycle.

3. The method of claim 1, the identification of the first and the second leakage currents further comprising:
    identifying the first and the second leakage currents with reference to a ratio between the PWM duty cycle and a corrected PWM duty cycle.

4. The method of claim 1, the identification of the first and the second leakage currents further comprising:
    identifying the first and the second leakage currents with reference to the ratio of the PWM duty cycle and the corrected PWM duty cycle and a corrected DC voltage for the power supply bus.

5. The method of claim 1 further comprising:
    identifying an operational temperature for the electrical motor with reference to the linear relationship between the first and the second leakage currents.

6. The method of claim 5, the identification of the operational temperature further comprising:
    identifying the operational temperature with reference to a resistance change in a winding of the electrical motor identified with reference to the linear relationship between the first and the second leakage currents.

7. The method of claim 6 further comprising:
    identifying a voltage error correction factor for the first voltage and the second voltage supplied by the power supply bus.

8. The method of claim 7 further comprising:
    identifying a voltage error correction factor with reference to a temperature of a heat sink associated with a thermistor used to identify the operational temperature.

9. The method of claim 1 wherein the first voltage is a low voltage of an operational voltage range for the power supply bus and the second voltage is a high voltage on the operational voltage range.

* * * * *